United States Patent
Yokosawa

(10) Patent No.: US 10,104,768 B2
(45) Date of Patent: Oct. 16, 2018

(54) SIZING AGENT FOR QUARTZ GLASS FIBERS, QUARTZ GLASS FIBER, QUARTZ GLASS YARN, AND QUARTZ GLASS CLOTH

(71) Applicant: SHIN-ETSU QUARTZ PRODUCTS CO., LTD., Shinjuku-ku, Tokyo (JP)

(72) Inventor: Yuya Yokosawa, Koriyama (JP)

(73) Assignee: SHIN-ETSU QUARTZ PRODUCTS CO., LTD., Tokyo (JP)

(*) Notice: Subject to any disclaimer, the term of this patent is extended or adjusted under 35 U.S.C. 154(b) by 45 days.

(21) Appl. No.: 15/177,724

(22) Filed: Jun. 9, 2016

(65) Prior Publication Data

US 2016/0362330 A1    Dec. 15, 2016

(30) Foreign Application Priority Data

Jun. 15, 2015  (JP) ................. 2015-120524

(51) Int. Cl.

| | |
|---|---|
| *C03C 13/06* | (2006.01) |
| *H05K 1/03* | (2006.01) |
| *C03C 25/1095* | (2018.01) |
| *C03C 25/28* | (2018.01) |
| *C03C 25/321* | (2018.01) |
| *C09D 103/02* | (2006.01) |
| *C09D 103/04* | (2006.01) |
| *C09D 103/08* | (2006.01) |

(52) U.S. Cl.
CPC ....... *H05K 1/0306* (2013.01); *C03C 25/1095* (2013.01); *C03C 25/28* (2013.01); *C03C 25/321* (2013.01); *C09D 103/02* (2013.01); *C09D 103/04* (2013.01); *C09D 103/08* (2013.01)

(58) Field of Classification Search
CPC ......... C08L 31/04; C08L 3/04; C09D 103/02; C09D 103/04; C03C 25/1095; C03C 25/28; C03C 25/34; H05K 1/036; D21H 7/29; B01J 47/018
USPC ........... 428/327, 461, 515; 427/388.4
See application file for complete search history.

(56) References Cited

FOREIGN PATENT DOCUMENTS

| | | | |
|---|---|---|---|
| GB | 1350400 | * | 4/1974 |
| GB | 1 359 558 A | | 7/1974 |
| JP | 55-126552 A | | 9/1980 |

(Continued)

OTHER PUBLICATIONS

European Search Report for Application No. EP 16 17 4373 dated Sep. 15, 2016.

*Primary Examiner* — Camie S Thompson
(74) *Attorney, Agent, or Firm* — Cheng Law Group, PLLC

(57) ABSTRACT

Provided are a sizing agent for quartz glass fibers capable of suppressing charging of quartz glass fibers, and suppressing generation of fluff in a production process for quartz glass fibers and a weaving process for a quartz glass cloth, a quartz glass fiber or a quartz glass yarn having applied thereonto the sizing agent, a quartz glass cloth, a prepreg for a printed circuit board, and a product using the quartz glass fiber. The sizing agent for quartz glass fibers includes an aqueous solution containing: a cationic vinyl acetate copolymer emulsion in which a cationic vinyl acetate copolymer having a weight average molecular weight of from 5,000 to 500,000 is dispersed in water; and starch, in which emulsion particles of the cationic vinyl acetate copolymer emulsion have a 50% diameter on a volume basis of from 0.1 μm to 5 μm.

8 Claims, 1 Drawing Sheet

(56) References Cited

FOREIGN PATENT DOCUMENTS

| | | | |
|---|---|---|---|
| JP | 61-258043 A | | 11/1986 |
| JP | 1-252554 A | | 10/1989 |
| JP | 1-313346 A | | 12/1989 |
| JP | 5-330860 A | | 12/1993 |
| JP | 8-291469 A | | 11/1996 |
| JP | 11-1348 A | | 1/1999 |
| JP | 2004-99377 A | | 4/2004 |
| JP | 2004-353132 | * | 12/2004 |
| JP | 2005-132713 A | | 5/2005 |
| JP | 2006-282401 A | | 10/2006 |
| JP | 2007-153706 A | | 6/2007 |
| WO | WO-2012/030556 A1 | | 3/2012 |

* cited by examiner

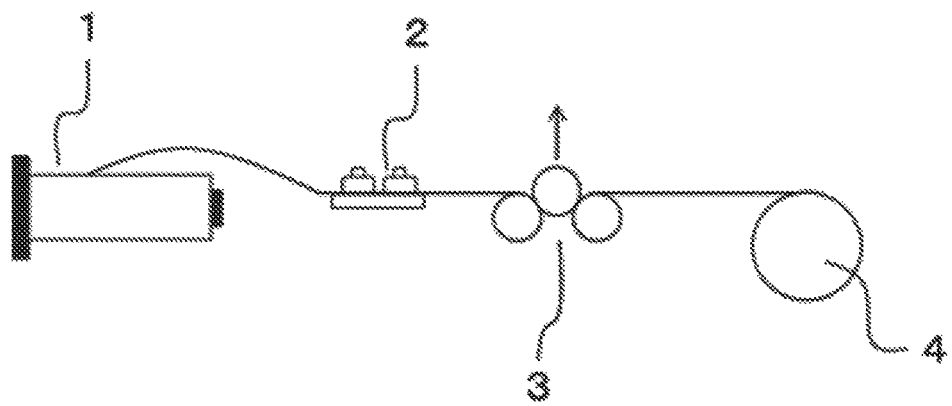

SIZING AGENT FOR QUARTZ GLASS FIBERS, QUARTZ GLASS FIBER, QUARTZ GLASS YARN, AND QUARTZ GLASS CLOTH

BACKGROUND OF THE INVENTION

1. Field of the Invention

The present invention relates to a sizing agent for quartz glass fibers, a quartz glass fiber or a quartz glass yarn having applied thereonto the sizing agent, a quartz glass cloth, a prepreg for a printed circuit board, and a product using the quartz glass fiber.

2. Description of the Related Art

An E-glass cloth, a D-glass cloth, and the like obtained by weaving E-glass fibers, D-glass fibers, and the like have hitherto been used as a glass cloth to be used in a multi-layer printed circuit board.

However, in recent years, along with reductions in weight, thickness, length, and size, and multifunctionalization of high-performance mobile terminals, such as a smartphone and a tablet PC, the multi-layer printed circuit board, on which various electronic components are installed, has been required to adopt high density interconnection, have excellent high frequency characteristics, be highly multi-layered, and be reduced in thickness. With such background, low thermal expansion, a low dielectric constant, and thinning are strongly demanded for the glass cloth serving as a base material constituting the printed circuit board.

Therefore, among glass fibers, quartz glass fibers having a low linear expansion coefficient and having a low dielectric constant and dielectric tangent have attracted attention. A quartz glass cloth using the quartz glass fibers is specifically required to have a thickness of 20 µm or less.

In general, the glass cloth is obtained by weaving glass fibers having applied thereonto a sizing agent containing starch as a main component of a coating forming agent. As a loom to be used in the weaving, an air jet loom configured to jet weft with air is generally used from the viewpoints of productivity and dimensional stability of the cloth.

However, in the weaving with the air jet loom, there is a problem that fluff is liable to be generated on the glass cloth because a glass fiber bundle is jetted at significantly high speed. The fluff on a surface of the glass cloth is unfavorable because, in the printed circuit board manufactured by laminating a thin copper foil or the like on a prepreg subjected to provisional curing through impregnation of the glass cloth with a resin, the fluff has a risk of damaging the copper foil or the like and causes an electrical insulation failure. Therefore, it is necessary that the amount of the fluff on the surface of the glass cloth be significantly small.

A cause for the generation of the fluff on the surface of the glass cloth is, for example, chargeability of the glass fibers, and particularly in the case of quartz glass, the generation of the fluff is remarkable. For example, multicomponent glass, such as E-glass, which is used as a versatile product, has electrical conductivity in a molten state, and besides, is spun from a platinum-based nozzle at the time of spinning. Therefore, the multicomponent glass is relatively less liable to be charged. In addition, it is obvious that also alkali-free glass containing 0.2 wt % or less of an alkali metal oxide ($Li_2O$, $Na_2O$, or $K_2O$) has electrical conductivity in a molten state also from the fact that a melting method using current application is utilized in Patent Document 1.

Meanwhile, the quartz glass does not contain any ion conductive species, such as alkali metals, and hence has low electrical conductivity even in a molten and softened state. Therefore, the quartz glass is liable to be charged. In actuality, while the quartz glass is spun by a known method as disclosed in Patent Documents 2-4, the quartz glass fibers are highly negatively charged at a charge potential of −2.0 kV or more at the time of spinning owing to friction with a flame stream, flow friction in the glass, and the like.

In order to suppress the fluff caused by static electricity in a production process for the glass fibers and a weaving process for the glass cloth, various sizing agents for glass fibers have hitherto been investigated. For example, a sizing agent for glass fibers disclosed in Patent Document 5 uses, as an antistatic agent, a cationic, non-ionic, anionic, or amphoteric surfactant. However, the sizing agent has a poor antistatic effect, and hence the antistatic agent is applied onto a glass fiber bundle again after the sizing agent for glass fibers is applied onto the glass fiber bundle and dried. In this case, the application of the sizing agent for glass fibers in two stages is troublesome and increases production cost. In addition, sizing agents for glass fibers disclosed in Patent Documents 6-7 have added thereto, as antistatic agents, octyldimethylammonium ethosulfate and a quaternary ammonium salt, such as lauryltrimethylammonium chloride or an alkylbenzyldimethylammonium chloride. However, those antistatic agents are liable to cause migration, and hence are not uniformly applied onto the surfaces of glass fibers, with the result that uneven adhesion of the antistatic agents is caused in the length direction of the glass fibers. The sizing agents even in such state are effective for glass fibers which are relatively less liable to be charged, such as E-glass fibers. However, when such sizing agent is applied to the quartz glass, an antistatic effect is not obtained sufficiently, and hence the quartz glass fibers are liable to be separated from each other, and the slip property of the quartz glass fibers lowers owing to, for example, their bonding to a loom jig, with the result that the generation of the fluff at the time of weaving cannot be suppressed.

Other than the addition of the antistatic agents described above, there has been an attempt to suppress the generation of static electricity through cationization of a coating forming agent. For example, in Patent Document 8, a dispersant formed of a linear cationic copolymer containing 65 mol % to 99 mol % of an ethylene structural unit and 1 mol % to 35 mol % of an acrylamide structural unit, and having a weight average molecular weight of 1,000 to 50,000 is added, to thereby control chargeability and thus suppress the fluff. However, acrylamide is classified as "a substance probably carcinogenic to humans (Group 2A)" in International Agency for Research on Cancer, and is not preferred from the viewpoint of health. In addition, in Patent Document 9, a copolymer emulsion obtained through emulsion polymerization of a vinyl acetate monomer and the like in the presence of a non-ionic surfactant alone or in the presence of the non-ionic surfactant and a cationic surfactant is added, to thereby enhance conformity with surfaces of the glass fibers and thus improve a bundling property. However, unwinding resistance between the respective glass strands is large, and the fluff cannot be suppressed. Further, a glass yarn does not successfully ride air owing to an excessively good bundling property, and weaving with the air jet loom is difficult. Meanwhile, in Patent Document 10, gelatinized starch is added in addition to an ethylene-vinyl acetate copolymer and a vinyl acetate polymer in order to lower the unwinding resistance between the respective glass strands. However, an antistatic effect is poor, and a quaternary ammonium salt is added.

Meanwhile, in Patent Document 11, there is disclosed that, while the charge potentials of a glass fiber bundle and glass fiber fabric in a weaving process are ideally controlled to ±0 kV, these charge potentials generally tend to largely change to a negative side with changes in temperature and humidity, and hence stable operation can be achieved when the center values of the charge potentials are controlled in advance to a slightly positive side, more specifically, to from +1.5 kV to −1.0 kV.

However, as described above, the quartz glass fibers are liable to be highly negatively charged, and hence it is difficult to keep the charge potential within a range of from +1.5 kV to −1.0 kV with the conventional sizing agents for glass fibers. As a result, the generation of the fluff on the surface of the glass cloth cannot be suppressed.

PRIOR ART DOCUMENTS

Patent Document

Patent Document 1: JP 2005-132713 A
Patent Document 2: JP 2006-282401 A
Patent Document 3: JP 2004-99377 A
Patent Document 4: JP Sho 61-258043 A
Patent Document 5: JP Hei 1-313346 A
Patent Document 6: JP Hei 1-252554 A
Patent Document 7: JP Sho 55-126552 A
Patent Document 8: JP Hei 5-330860 A
Patent Document 9: JP Hei 8-291469 A
Patent Document 10: JP Hei 11-1348 A
Patent Document 11: JP 2007-153706 A

SUMMARY OF THE INVENTION

The present invention is intended to solve the above-mentioned problems of the conventional sizing agents for glass fibers. That is, an object of the present invention is to provide a sizing agent for quartz glass fibers capable of suppressing charging of quartz glass fibers, and suppressing generation of fluff in a production process for quartz glass fibers and a weaving process for a quartz glass cloth, a quartz glass fiber or a quartz glass yarn having applied thereonto the sizing agent, a quartz glass cloth, a prepreg for a printed circuit board, and a product using the quartz glass fiber.

According to one embodiment of the present invention, there is provided a sizing agent for quartz glass fibers, including an aqueous solution containing: a cationic vinyl acetate copolymer emulsion in which a cationic vinyl acetate copolymer having a weight average molecular weight of from 5,000 to 500,000 is dispersed in water; and starch, in which emulsion particles of the cationic vinyl acetate copolymer emulsion have a 50% diameter on a volume basis of from 0.1 µm to 5 µm.

A quartz glass fiber according to one embodiment of the present invention has applied thereonto the sizing agent for quartz glass fibers.

The term "quartz glass fiber" as used herein refers to a thin thread-like object obtained by extending quartz glass, and a quartz glass filament, a quartz glass strand, a quartz glass yarn, quartz glass wool, and the like are obtained from the quartz glass fiber. In addition, in this specification, a single fiber is defined as a quartz glass filament, a bundle of the quartz glass filaments is defined as a quartz glass strand, and a twisted bundle of the quartz glass filaments is defined as a quartz glass yarn. A bundle of the quartz glass fibers is a quartz glass fiber bundle.

A quartz glass yarn according to one embodiment of the present invention has applied thereonto the sizing agent for quartz glass fibers.

The quartz glass yarn is suitably formed of quartz glass fibers formed of quartz glass filaments each having a diameter of from 3 µm to 8 µm.

The quartz glass yarn suitably has a charge potential of from +1.5 kV to −1.0 kV.

The quartz glass yarn suitably has a pulling resistance of from 0.1 cN to 50 cN.

A quartz glass cloth according to one embodiment of the present invention includes the quartz glass yarn. The quartz glass cloth may be manufactured by weaving the quartz glass yarn.

A prepreg for a printed circuit board according to one embodiment of the present invention includes the quartz glass cloth. The prepreg for a printed circuit board may be manufactured by impregnating the quartz glass cloth with a synthetic resin. In the manufacturing of the prepreg for a printed circuit board, the prepreg for a printed circuit board may be manufactured by, for example, weaving the quartz glass yarn to provide the quartz glass cloth, and then desizing the quartz glass cloth to which the sizing agent for quartz glass fibers adheres through heating, and applying another surface treatment agent onto the quartz glass cloth. A method of manufacturing the prepreg for a printed circuit board without desizing the quartz glass cloth to which the sizing agent for quartz glass fibers adheres through heating may be adopted.

A quartz glass fiber product according to one embodiment of the present invention includes the quartz glass fiber.

According to the present invention, the following remarkable effects are exhibited: the sizing agent for quartz glass fibers capable of suppressing charging of quartz glass fibers, and suppressing generation of fluff in a production process for quartz glass fibers and a weaving process for a quartz glass cloth, the quartz glass fiber or the quartz glass yarn having applied thereonto the sizing agent, the quartz glass cloth, the prepreg for a printed circuit board, and the product using the quartz glass fiber can be provided.

BRIEF DESCRIPTION OF THE DRAWINGS

FIG. 1 is a schematic view for illustrating a method of measuring pulling resistance of a glass yarn in Examples.

DETAILED DESCRIPTION OF THE PREFERRED EMBODIMENTS

Embodiments of the present invention are described below, but these embodiments are described as examples, and hence it is understood that various modifications may be made thereto without departing from the technical spirit of the present invention.

The term "cationic vinyl acetate copolymer emulsion" refers to an emulsion in which a vinyl acetate copolymer having a positively charged moiety in its molecular structure is dispersed in a liquid, and may be produced by, for example, a known method described below. Water is suitable as the liquid.

That is, the cationic vinyl acetate copolymer emulsion is obtained by emulsion polymerization or the like of a vinyl acetate monomer and a polyvinyl alcohol cationized with a compound having a cationic group, such as 3-chloro-2-hydroxypropyltrimethylammonium chloride, 3-chloroethyltrimethylammonium chloride, 3-chloropropyltrimethylammonium chloride, 2-acryloxyethyltrimethylammonium chloride, allyltrimethylammonium chloride, methallyltrimethylammonium chloride, or glycidyltrimethylammonium chloride. For example, an azo-based catalyst and a peroxide are given as a catalyst to be used in the copolymerization.

In the copolymerization, other copolymerizable monomers, such as ethylene, propylene, vinyl chloride, vinylpyrrolidone, an ester, maleic acid, and itaconic acid, may be copolymerized as long as the effects of the present invention are not impaired.

The cationic vinyl acetate copolymer emulsion to be used in the present invention is not particularly limited as long as the cationic vinyl acetate copolymer has a weight average molecular weight of from 5,000 to 500,000 and emulsion particles of the cationic vinyl acetate copolymer emulsion have a 50% diameter on a volume basis of from 0.1 μm to 5 μm. The cationic vinyl acetate copolymer has a weight average molecular weight of preferably from 50,000 to 500,000, more preferably from 80,000 to 500,000. Meanwhile, the emulsion particles of the cationic vinyl acetate copolymer emulsion have a 50% diameter on a volume basis of preferably from 0.1 μm to 2 μm, more preferably from 0.1 μm to 1 μm.

When the weight average molecular weight of the cationic vinyl acetate copolymer is less than 5,000, a glass yarn bundling property lowers, and hence fluff is liable to be generated. When the weight average molecular weight of the cationic vinyl acetate copolymer is more than 500,000, a glass yarn becomes harder, and glass filaments are broken particularly at the intersection of warp and weft of a glass cloth at the time of weaving, with the result that the fluff cannot be suppressed. In addition, when the 50% diameter on a volume basis of the emulsion particles of the cationic vinyl acetate copolymer emulsion is less than 0.1 μm, the emulsion particles are trapped in gaps of starch molecules coexisting in a sizing agent for quartz glass fibers, and hence an antistatic effect exhibited by the cationic vinyl acetate copolymer is not obtained sufficiently, with the result that the fluff cannot be suppressed. Meanwhile, when the 50% diameter on a volume basis of the emulsion particles of the cationic vinyl acetate copolymer emulsion is more than 5 μm, the chemical stability of the cationic vinyl acetate copolymer emulsion lowers, and hence uniform application of the emulsion onto quartz glass fibers becomes difficult, with the result that fluff cannot be suppressed.

The blending ratio of the cationic vinyl acetate copolymer emulsion in the sizing agent is not particularly limited, but is, for example, from 0.01 wt % to 20 wt %, preferably from 0.01 wt % to 10 wt %, more preferably from 0.1 wt % to 5 wt % in terms of a solid content with respect to 100 wt % of the total amount of the sizing agent for quartz glass fibers. When the blending ratio is less than 0.01 wt %, a sufficient coating cannot be formed on the glass fibers, and hence the antistatic effect is not obtained sufficiently. When the blending ratio is more than 20 wt %, further improvement in the antistatic effect cannot be expected, and further, a desizing property lowers.

Starch to be used in the present invention is not particularly limited, but, for example, corn starch, tapioca starch, wheat starch, potato starch, rice starch, and the like may be used. The starch may be subjected to processing, such as etherification, esterification, grafting, or crosslinking.

The blending ratio of the starch in the sizing agent is not particularly limited, but is, for example, from 0.1 wt % to 20 wt %, preferably from 0.1 wt % to 10 wt %, more preferably from 0.1 wt % to 5 wt % with respect to 100 wt % of the total amount of the sizing agent for quartz glass fibers. When the blending ratio is less than 0.1 wt %, a sufficient coating cannot be formed on the glass fibers. When the blending ratio is more than 20 wt %, the desizing property lowers.

In addition to the cationic vinyl acetate copolymer emulsion and the starch described above, the sizing agent for quartz glass fibers of the present invention may contain other components the effects of the present invention are not impaired. Examples of the other components include a lubricant, an emulsifier, a cationic softener, an antistatic agent, a silane coupling agent, and an antiseptic. In addition, an alcohol, such as methanol, ethanol, or isopropanol, or any other organic solvent may be added in a small amount to the sizing agent for quartz glass fibers of the present invention.

It is suitable that the lubricant be added for the purpose of enhancing the slip property of the glass fibers. It is suitable that the emulsifier be added for the purpose of dispersing the lubricant in water. It is suitable that the cationic softener be added for the purpose of softening the glass fibers. It is suitable that the silane coupling agent be added for the purpose of increasing the strength of the glass fibers. It is suitable that the antiseptic be added for the purpose of suppressing generation of mold on the starch.

A quartz glass fiber of the present invention has applied thereonto the sizing agent for quartz glass fibers formed of an aqueous solution containing: the cationic vinyl acetate copolymer emulsion in which the cationic vinyl acetate copolymer having a weight average molecular weight of from 5,000 to 500,000 is dispersed in water; and the starch, in which the emulsion particles of the cationic vinyl acetate copolymer emulsion have a 50% diameter on a volume basis of from 0.1 μm to 5 μm. With this, the charge potential and pulling resistance of the quartz glass fiber can be kept within ranges of from +1.5 kV to −1.0 kV and from 0.1 cN to 50 cN, respectively. As a result, a quartz glass cloth with a small amount of fluff can be obtained.

As a method of allowing the sizing agent for quartz glass fibers of the present invention to adhere to the quartz glass fibers, a known method may be adopted. Examples of such method include an immersion method, a method involving using a roller-type or belt-type applicator, and a spray method.

A quartz glass cloth of the present invention preferably includes a glass yarn of the present invention, and is more preferably formed only of the glass yarn of the present invention, because the charge potential and pulling resistance of the glass yarn can be kept within ranges of from +1.5 kV to −1.0 kV and from 0.1 cN to 50 cN, respectively, with the result that the fluff can be effectively suppressed.

The weave construction, weave density, and the like of the quartz glass cloth of the present invention are not particularly limited, but examples of the weave construction include a plain weave, a satin weave, a basket weave, and a twill weave. In addition, the weave density is, for example, from 10 yarns/25 mm to 1.50 yarns/25 mm.

A weaving method for the quartz glass cloth of the present invention is not particularly limited, but examples of the method include a method involving using an air jet loom, a method involving using a water jet loom, a method involving using a rapier loom, and a method involving using a shuttle loom. Of those, a method involving using an air jet loom is suitable from the viewpoints of productivity and the dimensional stability of the glass cloth.

The quartz glass cloth of the present invention may be subjected to washing with water, desizing through heating, or opening treatment, as required.

EXAMPLES

The present invention is hereinafter described in more detail with Examples, but it is needless to say that Examples are only illustrative and not intended to be interpreted in a limited way.

Measurement and evaluation in the following Examples, Comparative Examples, and Reference Example were performed by the following methods.

1. Weight Average Molecular Weight of Vinyl Acetate Copolymer

A vinyl acetate copolymer was dissolved in tetrahydrofuran, and a soluble component was collected. Next, the weight average molecular weight of the soluble component in terms of polystyrene was measured with a size exclusion chromatography Shodex GPC-104 manufactured by Showa Denko K.K.

2. 50% Diameter on Volume Basis (D50) of Emulsion Particles of Vinyl Acetate Copolymer Emulsion The 50% diameter on a volume basis of emulsion particles of a vinyl acetate copolymer emulsion was measured with a laser diffraction/scattering particle size distribution analyzer LA-950V2 manufactured by Horiba, Ltd. The refractive indices of a vinyl acetate copolymer and water serving as a solvent were set to 1.460 and 1.333, respectively. The "50% diameter on a volume basis" refers to a 50% cumulative particle diameter in a particle diameter distribution on a volume basis represented as a cumulative distribution.

3. Charge Potential of Glass Yarn

An electrostatic measuring instrument STATIRON DX-01 manufactured by Shishido Electrostatic, Ltd. was placed at a distance of 5 cm from an outermost glass yarn wound around a bobbin, and the charge potential of the glass yarn was continuously measured while the glass yarn was jetted at an air pressure of 0.1 MPa. The measurement time was set to 1 minute, and an average charge potential was calculated.

4. Pulling Resistance of Glass Yarn (Slip Property)

In a device as illustrated in FIG. 1, a glass yarn 1 was pulled from a bobbin at a winding speed of 20 m/min with a winder 4, and the pulling resistance (slip property) of the glass yarn was measured with an online tension meter 3 while a load was applied to the glass yarn 1 with tension washers 2. Four tension washers each having a weight of 3.5 g were used. The measurement time was set to 1 minute, and an average pulling resistance was calculated.

5. Thickness of Glass Cloth

The thickness of the glass cloth was measured by a method described in the JIS R3420 201.3 7.10.1A method.

6. Fluff Number of Glass Cloth

Five areas of 3 mm square were visually observed with an optical microscope while sidelight was radiated to the glass cloth, and the number of bright points was counted. The total number of bright points was adopted as the fluff number, and the case where the fluff number was five or less was regarded as acceptable.

Example 1

A sizing agent for quartz glass fibers containing: 0.5 wt % of a cationic vinyl acetate copolymer emulsion in terms of a solid content in which a cationic vinyl acetate copolymer had a weight average molecular weight of 100,000 and emulsion particles of the cationic vinyl acetate copolymer emulsion had a 50% diameter on a volume basis of 0.6 µm; 1.25 wt % of hydroxypropyl ether starch serving as first starch; 1.25 wt % of hydroxypropyl crosslinked starch serving as second starch; and as other components, 0.5 wt % of beef tallow serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.05 wt % of octyldimethylethyl ammonium ethylsulfate serving as an antistatic agent, 0.1 wt % of N-2-(aminoethyl)-3-aminopropylmethoxysilane serving as a silane coupling agent, and 0.01 wt % of an antiseptic, with the balance being water, was prepared.

A quartz glass material was loaded in burner flame, and the above-mentioned sizing agent for quartz glass fibers was applied thereonto while the material was extended. Thus, a quartz glass strand formed of 50 quartz glass filaments each having a diameter of 3.5 µm was produced. Next, the resultant quartz glass strand was twisted 0.2 times per 25 mm, to produce a quartz glass yarn. The quartz glass yarn was used for the measurement of the charge potential and pulling resistance of a quartz glass yarn.

The resultant quartz glass yarn was set to an air jet loom, and a plain weave quartz glass cloth having a warp density of 95 yarns/25 mm and a weft density of 95 yarns/25 mm was obtained through weaving. The quartz glass cloth was used for the measurement of the thickness and fluff number of a quartz glass cloth. The results are shown in Table 1.

Example 2

A sizing agent for quartz glass fibers containing: 0.5 wt % of a cationic vinyl acetate copolymer emulsion in terms of a solid content in which a cationic vinyl acetate copolymer had a weight average molecular weight of 6,000 and emulsion particles of the cationic vinyl acetate copolymer emulsion had a 50% diameter on a volume basis of 0.4 µm; 1.25 wt % of hydroxypropyl ether starch serving as first starch; 1.25 wt % of hydroxypropyl crosslinked starch serving as second starch; and as other components, 0.5 wt % of beef tallow serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.05 wt % of octyldimethylethyl ammonium ethylsulfate serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 1 except for the foregoing. The results are shown in Table 1.

Example 3

A sizing agent for quartz glass fibers containing: 1 wt % of a cationic vinyl acetate copolymer emulsion in terms of a solid content in which a cationic vinyl acetate copolymer had a weight average molecular weight of 350,000 and emulsion particles of the cationic vinyl acetate copolymer emulsion had a 50% diameter on a volume basis of 1 µm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared.

A quartz glass material was loaded in burner flame, and the above-mentioned sizing agent for quartz glass fibers was applied thereonto while the material was extended. Thus, a quartz glass strand formed of 50 quartz glass filaments each having a diameter of 4 μm was produced. Next, the resultant quartz glass strand was twisted 0.2 times per 25 mm, to produce a quartz glass yarn. The quartz glass yarn was used for the measurement of the charge potential and pulling resistance of a quartz glass yarn.

The resultant quartz glass yarn was set to an air jet loom, and a plain weave quartz glass cloth having a warp density of 95 yarns/25 mm and a weft density of 95 yarns/25 mm was obtained through weaving. The quartz glass cloth was used for the measurement of the thickness and fluff number of a quartz glass cloth. The results are shown in Table 1.

Example 4

A sizing agent for quartz glass fibers containing: 1 wt % of a cationic vinyl acetate copolymer emulsion in terms of a solid content in which a cationic vinyl acetate copolymer had a weight average molecular weight of 10,000 and emulsion particles of the cationic vinyl acetate copolymer emulsion had a 50% diameter on a volume basis of 0.2 μm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 3 except for the foregoing. The results are shown in Table 2.

Example 5

A sizing agent for quartz glass fibers containing: 1 wt % of a cationic vinyl acetate copolymer emulsion in terms of a solid content in which a cationic vinyl acetate copolymer had a weight average molecular weight of 200,000 and emulsion particles of the cationic vinyl acetate copolymer emulsion had a 50% diameter on a volume basis of 2 μm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.1 wt % of N-2-(aminoethyl)-3-aminopropylmethoxysilane serving as a silane coupling agent, and 0.01 wt % of an antiseptic, with the balance being water, was prepared. An antistatic agent was not added to the sizing agent for quartz glass fibers. A quartz glass cloth was obtained in the same manner as in Example 3 except for the foregoing. The results are shown in Table 2.

Example 6

A sizing agent for quartz glass fibers containing: 1 wt % of a cationic vinyl acetate copolymer emulsion in terms of a solid content in which a cationic vinyl acetate copolymer had a weight average molecular weight of 470,000 and emulsion particles of the cationic vinyl acetate copolymer emulsion had a 50% diameter on a volume basis of 4 μm; 1.5 wt % of hydroxypropyl ether starch serving as first starch; 1.5 wt % of hydroxypropyl crosslinked starch serving as second starch; and as other components, 0.6 wt % of beef tallow serving as a lubricant, 0.14 wt % of a polyoxyethylene alkyl ether serving as an emulsifier, 0.3 wt % of an acetate of a condensation product of polyethylene pentamine with stearic acid serving as a cationic softener, 0.34 wt % of distearyldimethylammonium chloride serving as an antistatic agent, 0.12 wt % of N-2-(aminoethyl)-3-aminopropylmethoxysilane serving as a silane coupling agent, and 0.01 wt % of an antiseptic, with the balance being water, was prepared.

A quartz glass material was loaded in burner flame, and the above-mentioned sizing agent for quartz glass fibers was applied thereonto while the material was extended. Thus, a quartz glass strand formed of 200 quartz glass filaments each having a diameter of 7 μm was produced. Next, the resultant quartz glass strand was twisted 0.6 times per 25 mm, to produce a quartz glass yarn. The quartz glass yarn was used for the measurement of the charge potential and pulling resistance of a quartz glass yarn.

The resultant quartz glass yarn was set to an air jet loom, and a plain weave quartz glass cloth having a warp density of 65 yarns/25 mm and a weft density of 65 yarns/25 mm was obtained through weaving. The quartz glass cloth was used for the measurement of the thickness and fluff number of a quartz glass cloth. The results are shown in Table 2.

Example 7

A sizing agent for quartz glass fibers containing: 1 wt % of a cationic vinyl acetate copolymer emulsion in terms of a solid content in which a cationic vinyl acetate copolymer had a weight average molecular weight of 60,000 and emulsion particles of the cationic vinyl acetate copolymer emulsion had a 50% diameter on a volume basis of 0.5 μm; 1.5 wt % of hydroxypropyl ether starch serving as first starch; 1.5 wt % of hydroxypropyl crosslinked starch serving as second starch; and as other components, 0.6 wt % of beef tallow serving as a lubricant, 0.14 wt % of a polyoxyethylene alkyl ether serving as an emulsifier, 0.3 wt % of an acetate of a condensation product of polyethylene pentamine with stearic acid serving as a cationic softener, 0.34 wt % of distearyldimethylammonium chloride serving as an antistatic agent, 0.12 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 6 except for the foregoing. The results are shown in Table 3.

Example 8

A sizing agent for quartz glass fibers containing: 1 wt % of a cationic vinyl acetate copolymer emulsion in terms of a solid content in which a cationic vinyl acetate copolymer had a weight average molecular weight of 60,000 and emulsion particles of the cationic vinyl acetate copolymer emulsion had a 50% diameter on a volume basis of 0.5 μm; 1.5 wt % of hydroxypropyl ether starch serving as first starch; 1.5 wt % of hydroxypropyl crosslinked starch serving as second starch; and as other components, 0.6 wt % of beef tallow serving as a lubricant, 0.14 wt % of a polyoxyethylene alkyl ether serving as an emulsifier, 0.3 wt % of an acetate of a condensation product of polyethylene pentamine with stearic acid serving as a cationic softener, 0.12 wt % of N-2-(aminoethyl)-3-aminopropylmethoxysilane serving as a silane coupling agent, and 0.01 wt % of an antiseptic, with the balance being water, was prepared. An antistatic agent was not added to the sizing agent for quartz glass fibers. A quartz glass cloth was obtained in the same manner as in Example 6 except for the foregoing. The results are shown in Table 3.

Example 9

A sizing agent for quartz glass fibers containing: 0.5 wt % of a cationic vinyl acetate copolymer emulsion in terms of a solid content in which a cationic vinyl acetate copolymer had a weight average molecular weight of 150,000 and emulsion particles of the cationic vinyl acetate copolymer emulsion had a 50% diameter on a volume basis of 0.2 µm; 1.5 wt % of hydroxypropyl ether starch serving as first starch; 1.5 wt % of hydroxypropyl crosslinked starch serving as second starch; and as other components, 0.6 wt % of beef tallow serving as a lubricant, 0.14 wt % of a polyoxyethylene alkyl ether serving as an emulsifier, 0.3 wt % of an acetate of a condensation product of polyethylene pentamine with stearic acid serving as a cationic softener, 0.34 wt % of distearyldimethylammonium chloride serving as an antistatic agent, 0.12 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 6 except for the foregoing. The results are shown in Table 3.

Comparative Example 1

A sizing agent for quartz glass fibers containing: 1 wt % of a non-ionic vinyl acetate copolymer emulsion in terms of a solid content in which a non-ionic vinyl acetate copolymer had a weight average molecular weight of 350,000 and emulsion particles of the non-ionic vinyl acetate copolymer emulsion had a 50% diameter on a volume basis of 1 µm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 3 except for the foregoing. The results are shown in Table 4.

Comparative Example 2

A sizing agent for quartz glass fibers containing: 1 wt % of a cationic vinyl acetate copolymer emulsion in terms of a solid content in which a cationic vinyl acetate copolymer had a weight average molecular weight of 3,000 and emulsion particles of the cationic vinyl acetate copolymer emulsion had a 50% diameter on a volume basis of 1 µm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 3 except for the foregoing. The results are shown in Table 4.

Comparative Example 3

A sizing agent for quartz glass fibers containing: 1 wt % of a cationic vinyl acetate copolymer emulsion in terms of a solid content in which a cationic vinyl acetate copolymer had a weight average molecular weight of 600,000 and emulsion particles of the cationic vinyl acetate copolymer emulsion had a 50% diameter on a volume basis of 1 µm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 3 except for the foregoing. The results are shown in Table 4.

Comparative Example 4

A sizing agent for quartz glass fibers containing: 1 wt % of a cationic vinyl acetate copolymer emulsion in terms of a solid content in which a cationic vinyl acetate copolymer had a weight average molecular weight of 350,000 and emulsion particles of the cationic vinyl acetate copolymer emulsion had a 50% diameter on a volume basis of 0.05 µm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 3 except for the foregoing. The results are shown in Table 5.

Comparative Example 5

A sizing agent for quartz glass fibers containing: 1 wt % of a cationic vinyl acetate copolymer emulsion in terms of a solid content in which a cationic vinyl acetate copolymer had a weight average molecular weight of 350,000 and emulsion particles of the cationic vinyl acetate copolymer emulsion had a 50% diameter on a volume basis of 10 µm; 1.45 wt % of hydroxypropyl ether starch serving as first starch; 1.05 wt % of hydroxypropyl crosslinked starch serving as second starch; and as other components, 0.5 wt % of sesame oil serving as a lubricant, 0.11 wt % of a polyoxyethylene alkyl ether serving as an emulsifier, 0.25 wt % of an acetate of a condensation product of polyethylene pentamine with stearic acid serving as a cationic softener, 0.29 wt % of stearyltrimethylammonium chloride serving as an antistatic agent, 0.1 wt % of N-2-(aminoethyl)-3-aminopropylmethoxysilane serving as a silane coupling agent, and 0.01 wt % of an antiseptic, with the balance being water, was prepared. A quartz glass cloth was obtained in the same manner as in Example 3 except for the foregoing. The results are shown in Table 5.

Reference Example

The sizing agent for quartz glass fibers of Comparative Example 1 was prepared. An E-glass cloth was obtained in the same manner as in Example 3 except that the sizing agent was applied onto an E-glass yarn formed of E-glass filaments each having a diameter of 4 μm. The results are shown in Table 5.

TABLE 1

|  |  | Example 1 | Example 2 | Example 3 |
|---|---|---|---|---|
| Kind of vinyl acetate copolymer |  | Cationic | Cationic | Cationic |
| Weight average molecular weight of vinyl acetate copolymer |  | 100,000 | 6,000 | 350,000 |
| 50% diameter on volume basis of emulsion particles of vinyl acetate copolymer emulsion | μm | 0.6 | 0.4 | 1 |
| Diameter of glass filament | μm | 3.5 | 3.5 | 4 |
| Number of glass filaments | filaments | 50 | 50 | 50 |
| Charge potential of glass yarn | kV | +0.4 | +0.5 | +0.2 |
| Pulling resistance of glass yarn | cN | 13 | 18 | 15 |
| Thickness of glass cloth | mm | 0.011 | 0.011 | 0.014 |
| Fluff number of glass cloth | pieces | 0 | 2 | 0 |
| Total evaluation |  | ○ | ○ | ○ |

TABLE 2

|  |  | Example 4 | Example 5 | Example 6 |
|---|---|---|---|---|
| Kind of vinyl acetate copolymer |  | Cationic | Cationic | Cationic |
| Weight average molecular weight of vinyl acetate copolymer |  | 10,000 | 200,000 | 470,000 |
| 50% diameter on volume basis of emulsion particles of vinyl acetate copolymer emulsion | μm | 0.2 | 2 | 4 |
| Diameter of glass filament | μm | 4 | 4 | 7 |
| Number of glass filaments | filaments | 50 | 50 | 200 |
| Charge potential of glass yarn | kV | +0.2 | −0.4 | −0.5 |
| Pulling resistance of glass yarn | cN | 22 | 13 | 20 |
| Thickness of glass cloth | mm | 0.014 | 0.014 | 0.095 |
| Fluff number of glass cloth | pieces | 2 | 1 | 5 |
| Total evaluation |  | ○ | ○ | ○ |

TABLE 3

|  |  | Example 7 | Example 8 | Example 9 |
|---|---|---|---|---|
| Kind of vinyl acetate copolymer |  | Cationic | Cationic | Cationic |
| Weight average molecular weight of vinyl acetate copolymer |  | 60,000 | 60,000 | 150,000 |
| 50% diameter on volume basis of emulsion particles of vinyl acetate copolymer emulsion | μm | 0.5 | 0.5 | 0.2 |
| Diameter of glass filament | μm | 7 | 7 | 7 |
| Number of glass filaments | filaments | 200 | 200 | 200 |
| Charge potential of glass yarn | kV | +0.2 | −0.4 | +0.1 |
| Pulling resistance of glass yarn | cN | 14 | 18 | 11 |
| Thickness of glass cloth | mm | 0.095 | 0.095 | 0.095 |
| Fluff number of glass cloth | pieces | 2 | 4 | 1 |
| Total evaluation |  | ○ | ○ | ○ |

TABLE 4

|  | Comparative Example 1 | Comparative Example 2 | Comparative Example 3 |
|---|---|---|---|
| Kind of vinyl acetate copolymer | Non-ionic | Cationic | Cationic |
| Weight average molecular weight of vinyl acetate copolymer | 350,000 | 3,000 | 600,000 |

TABLE 4-continued

|  |  | Comparative Example 1 | Comparative Example 2 | Comparative Example 3 |
|---|---|---|---|---|
| 50% diameter on volume basis of emulsion particles of vinyl acetate copolymer emulsion | μm | 1 | 1 | 1 |
| Diameter of glass filament | μm | 4 | 4 | 4 |
| Number of glass filaments | filaments | 50 | 50 | 50 |
| Charge potential of glass yarn | kV | −5.3 | −0.9 | −0.1 |
| Pulling resistance of glass yarn | cN | 65 | 37 | 18 |
| Thickness of glass cloth | mm | 0.014 | 0.014 | 0.014 |
| Fluff number of glass cloth | pieces | 25 | 17 | 13 |
| Total evaluation |  | x | x | x |

TABLE 5

|  |  | Comparative Example 4 | Comparative Example 5 | Reference Example |
|---|---|---|---|---|
| Kind of vinyl acetate copolymer |  | Cationic | Cationic | Non-ionic |
| Weight average molecular weight of vinyl acetate copolymer |  | 350,000 | 350,000 | 350,000 |
| 50% diameter on volume basis of emulsion particles of vinyl acetate copolymer emulsion | μm | 0.05 | 10 | 1 |
| Diameter of glass filament | μm | 4 | 4 | 4 |
| Number of glass filaments | filaments | 50 | 50 | 50 |
| Charge potential of glass yarn | kV | −4.9 | −5.8 | −0.2 |
| Pulling resistance of glass yarn | cN | 69 | 81 | 14 |
| Thickness of glass cloth | mm | 0.014 | 0.014 | 0.014 |
| Fluff number of glass cloth | pieces | 19 | 22 | 2 |
| Total evaluation |  | x | x | o |

The charge potential and pulling resistance of each of the quartz glass yarns obtained in Examples 1 to 9 fell within ranges of from +1.5 kV to −1.0 kV and from 0.1 cN to 50 cN, respectively, because the quartz glass yarns each had applied thereonto the sizing agent for quartz glass fibers containing: a cationic vinyl acetate copolymer emulsion in which a cationic vinyl acetate copolymer had a weight average molecular weight of from 5,000 to 500,000 and emulsion particles of the cationic vinyl acetate copolymer emulsion had a 50% diameter on a volume basis of from 0.1 μm to 5 μm; and starch. In addition, in the quartz glass cloths obtained by weaving the quartz glass yarns, charging was sufficiently suppressed, and hence high-quality quartz glass cloths with an extremely small amount of fluff were able to be obtained.

Meanwhile, the glass yarn having applied thereonto the sizing agent for quartz glass fibers of Comparative Example 1 using the non-ionic vinyl acetate copolymer emulsion was highly negatively charged, and hence a yarn bundling force lowered, with the result that a large amount of fluff was generated during the weaving. The sizing agent for quartz glass fibers of Comparative Example 2, in which the cationic vinyl acetate copolymer had a small weight average molecular weight, had a poor bonding force between the quartz glass filaments, and hence a bundling property lowered, with the result that a large amount of fluff was generated during the weaving. The sizing agent for quartz glass fibers of Comparative Example 3, in which the cationic vinyl acetate copolymer had a large weight average molecular weight, provided a hard yarn, and hence the glass filaments were broken particularly at an intersection portion of warp and weft of the quartz glass cloth, and the quartz glass cloth was partly broken. In the sizing agent for quartz glass fibers of Comparative Example 4, in which the emulsion particles of the cationic vinyl acetate copolymer emulsion had a small 50% diameter on a volume basis, it is considered that the emulsion particles were trapped in gaps of coexisting starch molecules, and an antistatic effect was not able to be exhibited sufficiently. Therefore, the generation of static electricity was not able to be suppressed during the weaving, with the result that a large amount of fluff was generated. The sizing agent for quartz glass fibers of Comparative Example 5, in which the emulsion particles of the cationic vinyl acetate copolymer emulsion had a large 50% diameter on a volume basis, was not able to be uniformly applied onto the glass fibers owing to low stability of the cationic vinyl acetate copolymer emulsion. Therefore, local unevenness of the sizing agent for quartz glass fibers occurred, and a sufficient antistatic effect was not able to be obtained. In Reference Example, in which the sizing agent for quartz glass fibers used in Comparative Example 1 was applied onto the E-glass yarn, the amount of fluff generated was small in spite of the use of the non-ionic vinyl acetate copolymer emulsion, because E-glass was less liable to be charged as compared to quartz glass.

1: yarn, 2: tension washers, 3: tension meter, 4: winder.

What is claimed is:

1. A quartz glass fiber, which has applied thereonto a sizing agent, said sizing agent comprising an aqueous solution containing:
   a cationic vinyl acetate copolymer emulsion in which a cationic vinyl acetate copolymer having a weight average molecular weight of from 5,000 to 500,000 is dispersed in water; and
   starch,
   wherein emulsion particles of the cationic vinyl acetate copolymer emulsion have a 50% diameter on a volume basis of from 0.1 μm to 5 μm.

2. A quartz glass fiber product, comprising the quartz glass fiber of claim 1.

3. A quartz glass yarn, which has applied thereonto a sizing agent, said sizing agent comprising an aqueous solution containing:
- a cationic vinyl acetate copolymer emulsion in which a cationic vinyl acetate copolymer having a weight average molecular weight of from 5,000 to 500,000 is dispersed in water; and
- starch,
- wherein emulsion particles of the cationic vinyl acetate copolymer emulsion have a 50% diameter on a volume basis of from 0.1 µm to 5 µm.

4. A quartz glass yarn according to claim 3, wherein the quartz glass yarn is formed of quartz glass fibers formed of quartz glass filaments each having a diameter of from 3 µm to 8 µm.

5. A quartz glass yarn according to claim 3, wherein the quartz glass yarn has a charge potential of from +1.5 kV to −1.0 kV.

6. A quartz glass yarn according to claim 3, wherein the quartz glass yarn has a pulling resistance of from 0.1 cN to 50 cN.

7. A quartz glass cloth, comprising the quartz glass yarn according to claim 3.

8. A prepreg for a printed circuit board, comprising the quartz glass cloth of claim 7.

* * * * *